United States Patent [19]

Tran et al.

[11] Patent Number: 5,239,237
[45] Date of Patent: Aug. 24, 1993

[54] CONTROL CIRCUIT HAVING OUTPUTS WITH DIFFERING RISE AND FALL TIMES

[75] Inventors: John Tran, Sunnyvale; Mazin Khurshid, Campbell, both of Calif.

[73] Assignee: Zilog, Inc., Campbell, Calif.

[21] Appl. No.: 958,507

[22] Filed: Oct. 8, 1992

Related U.S. Application Data

[62] Division of Ser. No. 479,865, Feb. 14, 1990, Pat. No. 5,187,686.

[51] Int. Cl.⁵ .................. G11C 13/00; G11C 11/40
[52] U.S. Cl. .................. 365/189.05; 365/203; 365/230.08
[58] Field of Search .................. 365/189.01, 181, 203, 365/189.05, 239.08

[56] References Cited

U.S. PATENT DOCUMENTS

| | | | |
|---|---|---|---|
| 3,964,031 | 6/1976 | Eaton, Jr. .................. | 365/181 |
| 4,291,242 | 9/1981 | Schriber . | |
| 4,405,996 | 9/1983 | Stewart . | |
| 4,417,163 | 11/1983 | Otsuki et al. . | |
| 4,447,892 | 5/1984 | Ziba . | |
| 4,456,837 | 6/1984 | Schade, Jr. . | |
| 4,731,553 | 3/1988 | Van Lehn et al. . | |
| 4,740,713 | 4/1988 | Sakurai et al. .................. | 307/451 |
| 4,806,801 | 2/1989 | Argade et al. .................. | 307/451 |
| 4,849,935 | 7/1989 | Miyazawa . | |
| 4,852,064 | 7/1989 | Kim et al. . | |
| 4,879,670 | 11/1989 | Anami et al. .................. | 365/203 |

Primary Examiner—Terrell W. Fears
Attorney, Agent, or Firm—Majestic, Parsons, Siebert & Hsue

[57] ABSTRACT

A control circuit suitable for generating control signals for controlling the bit and select lines for a static RAM and also for use in a buffer for reducing transient current and for controlling the slew rate. The circuit comprises a pull up and a pull down transistor, each having a first and a second terminal, and a passing gate connecting the second terminals of the two transistors. The gates of the two transistors are controlled by a signal. A first control signal at the second terminal of the pull up transistor has a fast rise time and slow fall time with respect to the input signal and the second control signal at a second terminal of the pull down transistor has a fast fall time and slow rise time with respect to the input signal. When the control circuit is used for controlling a static RAM, the passing gate is always turned on. The two control signals are then used to control the bit and select lines of the static RAM. When a control signal is used in a buffer comprising a pull up and a pull down transistor, the input signal to the buffer is applied to the gate of the transistors ind the control circuit. The two control signals are applied to the gates of the pull up and pull down transistors of the buffer to reduce transient current.

6 Claims, 8 Drawing Sheets

CONTROL CIRCUIT HAVING OUTPUTS WITH DIFFERING RISE AND FALL TIMES this is a division of application Ser. No. 479,865, filed Feb. 14, 1990 now U.S. Pat. No. 5,187,686.

BACKGROUND OF THE INVENTION

This invention relates to a circuit for generating two control signals. This circuit is particularly useful for generating control signals suitable for controlling the reading and writing of data into a static random access memory and for improving the performance of buffers.

Data supplied to a static random access memory (RAM) in a static RAM array is usually supplied on bit lines. The particular static RAM in the array into which the data on the bit lines is to be written is selected by word or select lines.

The bit lines are usually precharged; this means that the bit lines are caused to be in the high logic state (e.g. 5 volts). Then when the data that is to be written into a static RAM cell are loaded onto the bit lines, one of the two bit lines is pulled low. In order to precharge the bit lines high before the loading of data, the bit lines should be precharged before the particular static RAM cell into which data is to be written is selected to prevent false data from being written.

The precharging of the bit lines is controlled by a precharge circuit and a precharge signal; the selection of the particular static RAM cell into which data is to be written or read is performed by setting the select line connected to such cell high (or low). After data has been written from the bit lines into the static RAM, the select line for the selected static RAM falls low (rises high) before the precharge circuit changes state in order to preserve the data already written into the static RAM.

The select signal on the select line and the precharge signal from the precharge circuit are derived from the same clock signal. However, in order to achieve the above effects, the precharge signal should have a fast rise time and a slow fall time compared to the clock signal and the select signal should have a slow rise time and a fast fall time in reference to the clock signal.

In conventional designs, precharge circuits have been used for controlling the bit line. However, such precharge circuits generate only a single control signal with a fast rise time and a slow fall time, but not the select signal with a slow rise time and a fast fall time. Therefore, another circuit will be needed to generate a select signal with a slow rise time and a fast fall time. It is therefore desirable to provide a control circuit of simple design which may be used to generate both types of signals.

A conventional CMOS output buffer includes a P-channel and a N-channel FET where the input signal to the buffer is applied to the gates of both transistors. One serious disadvantage of such conventional buffers is the large transient current generated by the buffer. For example, when the input signal rises from "0" to "1", during the transition period, the P-channel FET is not completely turned off when the N-channel FET begins to turn on. There is thus a transitional time period during which both FETs are turned on, which introduces large transient currents. It is therefore desirable to provide a control circuit for controlling the buffer in response to an input signal so that the changes in logic state in the input signal will not cause large transient currents to develop in the buffer.

SUMMARY OF THE INVENTION

The control circuit of this invention is suitable for generating control signals for controlling the bit and select lines for a static RAM. The control circuit of this invention is also suitable for use in a buffer for reducing transient current and to control the slew rate.

The control circuit of this invention generates two control signals in response to an input signal. The circuit comprises a pull up transistor having a first and a second terminal and a gate and a passing gate. The circuit also includes a pull down transistor having a first and a second terminal and a gate. The second terminals of the two transistors are connected through the passing gate. The gates of the two transistors are controlled by a signal. A first control signal at a second terminal of the pull up transistor has a fast rise time and slow fall time with respect to the input signal and the second control signal at the second terminal of the pull down transistor has a fast fall time and slow rise time with respect to the input signal.

The passing gate of the circuit may be turned on or off by an enabling means in the preferred embodiment. This feature enables the circuit, when implemented in an integrated circuit having input and output pins, to be tri-stated so that an output pin may be used as an input pin when the passing gate is disabled.

The control circuit is particularly suitable for controlling a static RAM. When the circuit is so used, the passing gate is turned on. The gates of the pull up and pull down transistors are controlled by two separate signals having the same logic states and having substantially the same rise and fall times. In the preferred embodiment, the gate of the pull up transistor is controlled by a clock signal and the gate of the pull down transistor is controlled by a select signal from a select line where the select signal rises and falls with the clock signal. The control circuit further includes means for applying voltages to the first terminals of the two transistors so that the first terminals are at opposite logic states and means for applying signals at the second terminals of the two transistors or signals derived therefrom to control the bit and select lines of the static RAM.

The control circuit is also suitable for use in a buffer to reduce transient currents. The buffer comprises an inverter including a pull up transistor and a pull down transistor each having two terminals and a gate. The buffer has an output and an input. One terminal of each of the two transistors of the inverter is connected to the output of the circuit. The control circuit for use in the buffer includes (a) a pull up transistor having a first and second terminal and a gate, (b) a passing gate which is turned on, (c) a pull down transistor having a first and second terminal and a gate, the second terminals of the two transistors of the control circuit being connected through said passing gate, said gates of the two transistors of the control circuit being controlled by an input signal at the input of the buffer, and (d) means for applying voltages to the first terminals of the two transistors of the control circuit so that the first terminals are at opposite logic states. The buffer also includes means for applying the signals at the two second terminals of the control circuit to control the gates of the two transistors of the inverter in response to the signal at the input of the buffer. A first control signal at the second terminal of the pull up transistor has a fast rise time and slow fall time with respect to the input signal and the second control signal at the second terminal of the pull down transistor has a fast fall time and slow rise time with respect to the input signal, so that transient current in the buffer is reduced.

Yet another aspect of the invention is directed towards a buffer with slew rate control. The buffer includes a first inverter including a first pull up transistor and a first pull down transistor, each having two terminals and a gate, said buffer having an input and an output. One terminal of each of the first transistors are connected to the output of the buffer. The gate of the first transistors are controlled by the input signal at the input of the buffer or a signal derived therefrom. The buffer includes a second inverter including a second pull up transistor and a second pull down transistor, each having two terminals and a gate. One terminal of each of the second transistors are connected to the output of the buffer. The buffer includes a first feedback path for deriving a first slew rate control signal from the input signal and an output signal at the buffer output for controlling the gate of the second pull up transistor and a second feedback path for deriving a second slew rate control signal from the input signal and the output signal at the buffer output for controlling the gate of the second pull down transistor, thereby controlling the slew rate of the buffer.

DETAILED DESCRIPTION OF THE INVENTION

Figure 1:
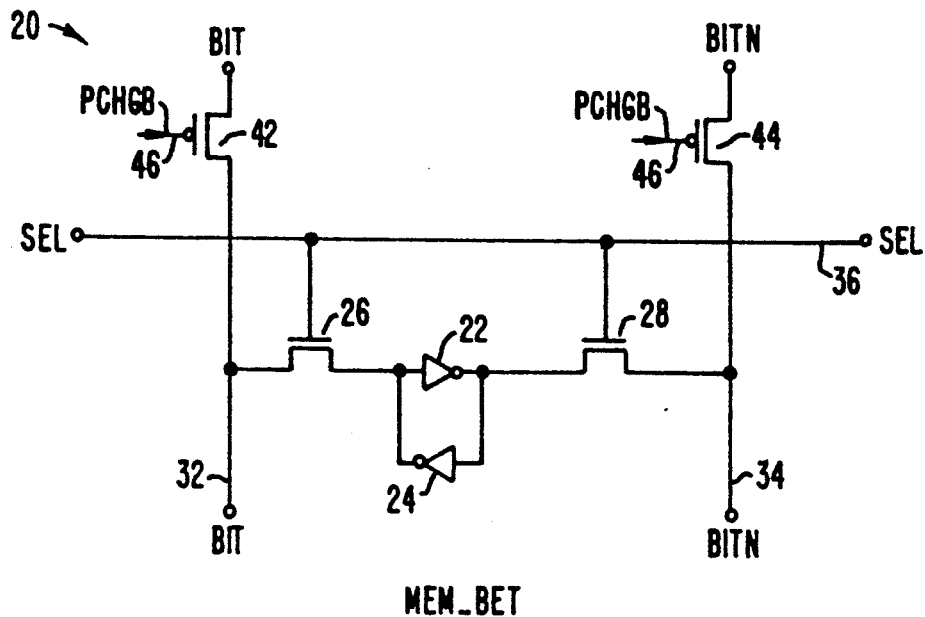
FIG. 1 is a schematic circuit diagram of a standard static RAM circuit useful as background to illustrate the invention.

FIG. 1 is a schematic view of a standard static RAM circuit as background useful for illustrating the invention. As shown in FIG. 1, static RAM 20 includes two inverters 22, 24 gated on both sides by two FETs 26, 28. Data is written into and read from the static RAM cell 20 through two bit lines 32, 34 (BIT, BITN). Cell 20 is usually one of many static RAM cells in an array. The particular RAM cell is selected for reading or writing by applying the appropriate signals to the select line 36.

When data is to be written into cell 20, data is applied to bit lines 32, 34. When cell 20 is selected for storing the data on the bit line, a signal applied to the select line 36 causes FETs 26, 28 to be turned on so that the logic states on bit lines 32, 34 will be stored at the inputs and outputs of inverters 22, 24. However, in order for true data to be written into and stored in cell 20, gates 26, 28 should not be turned on until the data to be written is already on bit lines 32, 34. Bit lines 32, 34 are controlled by a precharge (PCHGB) signal on line 46 through gates 42, 44.

A select signal applied to select line 36 and precharge signal applied to the gates of transistors 42, 44 are usually controlled by signals derived from the same clock signal. Thus in order to prevent false data from being written into cell 20, it is preferable for transistors 42, 44 to be turned off before transistors 26, 28 are turned on, so that the data to be written into cell 20 will already be present on bit lines 32, 34 before transistors 26, 28 are turned on, permitting the data on lines 32, 34 to be written into cell 20. Conversely, after data has been written into cell 20, it would be desirable for transistors 26, 28 to be turned off before transistors 42, 44 so that data already written into cell 20 would not be affected or erased by changes by the bit lines. Therefore, even though the precharge and select signals for controlling the reading and writing of data into cell 20 are derived from the same clock signal, it is preferable for the precharge signal to have a fast rise time and a slow fall time compared to the clock signal and the select signal on line 36 to have a slow rise time and a fast fall time relative to the clock signal.

Figure 2:
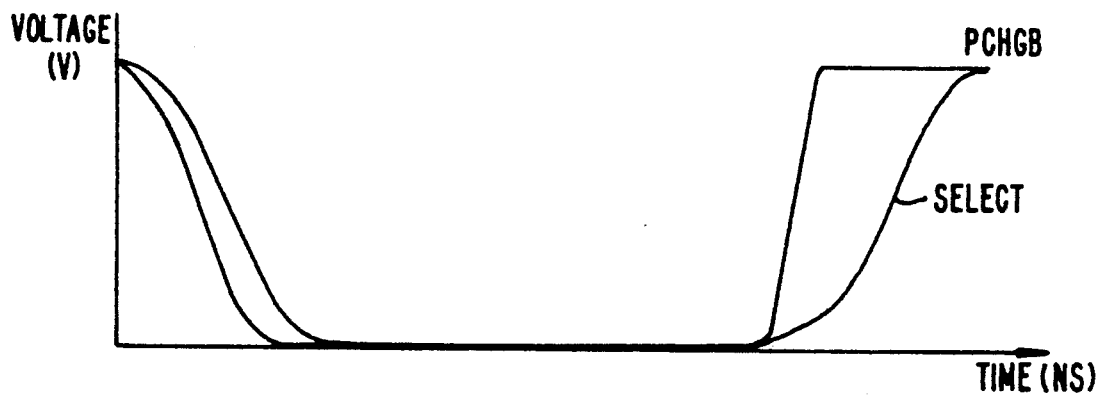
FIG. 2 is a schematic circuit diagram of a conventional circuit for deriving a precharge signal for controlling the static RAM circuit of FIG. 1.
Figure 2:
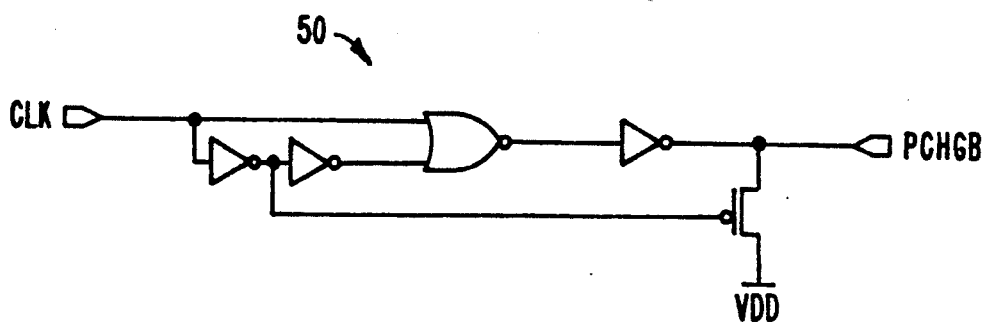

FIG. 2 is a schematic circuit diagram of a conventional precharge circuit for generating a precharge signal from a clock signal, where the precharge signal (PCHGB) has a fast rise time and a slow fall time relative to the clock (CLK). The conventional precharge circuit of FIG. 2, however, generates only the precharge signal and not the select signal having a slow rise time and a fast fall time relative to the clock. Furthermore, the precharge circuit of FIG. 2 requires 11 transistors. It is therefore desirable to provide a circuit of more compact layout which can be used to generate both the precharge signal having a fast rise time and a slow fall time as well as a select signal having a slow rise time and a fast fall time relative to the clock. Such circuit is illustrated in FIG. 3.

Figure 3:
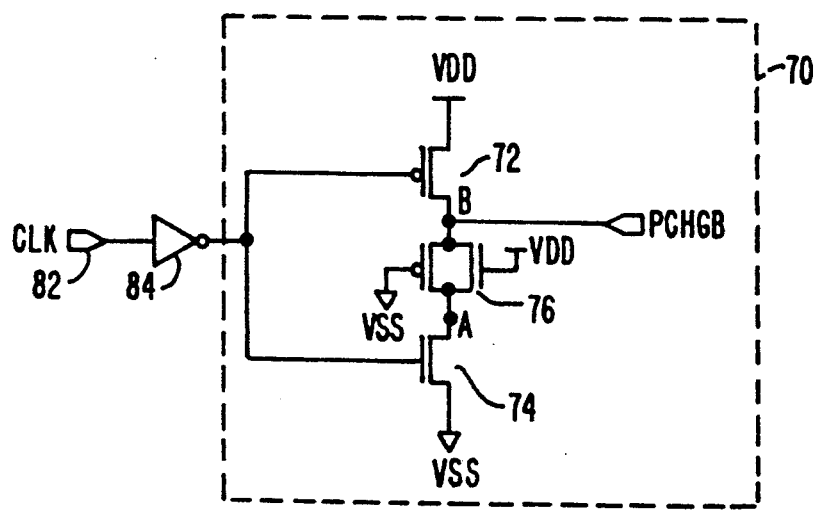
FIG. 3 is a schematic circuit diagram of a control circuit for generating control signals to illustrate the invention.

FIG. 3 is a schematic circuit diagram of a control circuit which is of more compact layout than that of FIG. 2, where the control circuit of FIG. 3 is capable of generating both the precharge signal and the select signal having the above-described timing characteristics relative to the clock. As shown in FIG. 3, the control circuit 70 comprises a pull up transistor 72 and a pull down transistor 74 where the two transistors are connected through a passing gate 76. A clock signal is applied to input 82, inverted by inverter 84, and then applied to the gates of transistors 72, 74.

In the preferred embodiment, the pull up transistor 72 is a P-channel FET and a pull down transistor 74 is an N-channel FET. Therefore, when the clock signal goes high, the output of inverter 84 falls low, causing transistor 72 to be turned on and transistor 74 to be turned off. Pull up transistor 72 is connected to a voltage VDD defining the high logic state and a pull down transistor 74 connected to a voltage source VSS defining the low logic state. Therefore, when the clock signal goes high, node B is pulled high. The rise time of the output at node B is delayed relative to the clock only by the RC delay of transistor 72. When the clock signal falls low, the output of inverter 84 goes high, thereby turning off transistor 72 and turning on transistor 74. Node A is therefore pulled low.

Node A is connected to node B through passing gate 76 which is always turned on as shown in FIG. 3. Therefore, passing gate 76 acts in essence as a resistor. Hence node B will then also be pulled low by discharging through passing gate 76 and transistor 74. The fall time of node B, however, is much slower than that of node A, since node B must discharge through passing gate 76 which introduces a considerable RC delay. Hence while the output of circuit 70 at node B generally follows the clock at input 82, the output at node B has a fast rise time and a slow fall time. The output of circuit 70 at node B is therefore suitable for use as a precharge signal.

Conversely, when the clock signal at input 82 goes high, the output of inverter 84 falls low, thereby turning off transistor 74 and turning on transistor 72. Node B is charged high, which in turn causes node A to go high. The charging of node A, however, must again pass through passing gate 76 which introduces considerable RC delay. Therefore, even though node A eventually follows the clock high, it has a much slower rise time compared to the clock. When the clock signal at input 82 falls low, the output at inverter 84 goes high, thereby turning on transistor 74 and turning off transistor 72. Node A is thereby pulled low quickly. Thus the output of circuit 70 at node A has a slow rise time and a fast fall time relative to the clock. The output at node A is therefore suitable for use as a select signal for controlling a static RAM.

Figure 4:
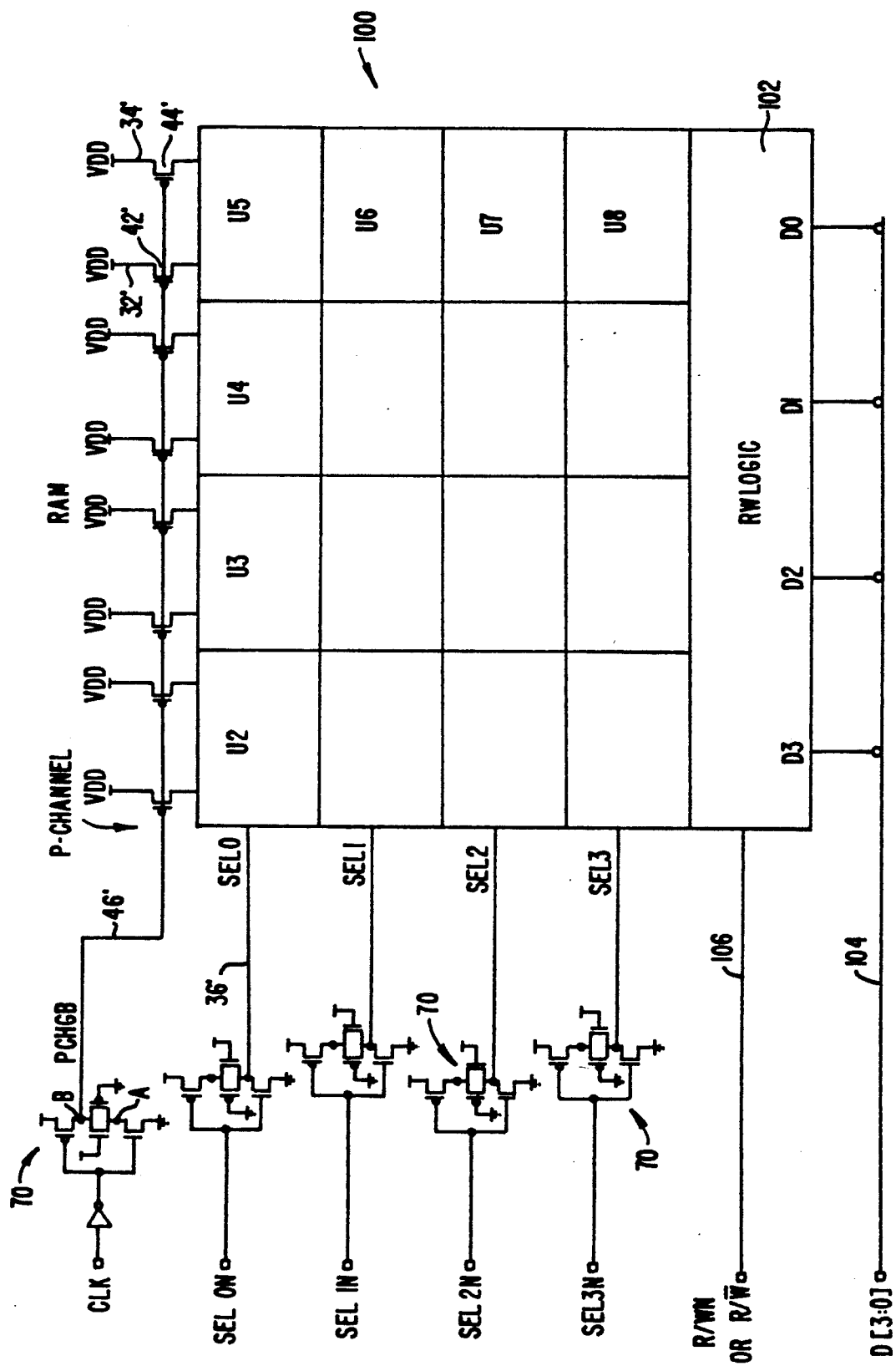
FIG. 4 is a schematic circuit diagram of a static RAM array and control circuits of the type in FIG. 3 to illustrate the invention.

FIG. 4 is a schematic circuit diagram of a static RAM array and control circuits of the type in FIG. 3 to illustrate the invention. As shown in FIG. 4, array 100 includes a 4×4 array of sixteen static RAM cells and a read-write logic 102. In conventional design, a static RAM array usually includes rows of static RAM cells, each of the type shown in FIG. 1, with eight such cells in each row for storing eight bits of information. To simplify the discussion, only four cells for storing four bits of information are shown in each row of FIG. 4. Each row of 4 or 8 bits stores 4 or 8 bits of data which may be written into or read from each row of cells at any one time. Therefore, each row of static RAM cells is connected to a single select line. As shown in FIG. 4, the four rows of cells are each selected by pulling high the corresponding select line of the four select lines SEL0-SEL3. Thus the four cells U2-U5 in the first row are each connected to and addressed by select line 36' (SEL0) in the same manner as shown in FIG. 1 for cell 20. The data to be written into each cell is provided through a pair of bit lines for each column of static RAM cells.

Data to be written into or read from the column U5-U8 are supplied or sensed from bit lines 32', 34'. Thus as far as the cell U5 is concerned, bit lines 32', 34' are equivalent to bit lines 32, 34 of FIG. 1 and select line 36' is equivalent to select line 36 of FIG. 1. The data to be written into array 100 is supplied to data bus 104. Read-write logic 102 is controlled by a R/WN signal on control line 106.

The reading and writing of data from or into array 100 is controlled by a central processor or other logic not shown in FIG. 4. Thus the particular row in array 100 into which data is to be read or written is selected by an address signal which is decoded by a decoder (not shown in FIG. 4). After decoding, the decoder causes one of the signals SEL0N-SEL3N to be high, the remaining signals being low. After passing through control circuit 70 (circuit 70 as described above in reference to FIG. 3), the select signal will have the proper slow rise time and fast fall time; the select signal is then applied to the appropriate row of static RAM cells to select the row of cells from which data is to be read onto bus 104 or into which data is to be written from bus 104. Meanwhile, a precharge signal on line 46' is derived through circuit 70 from a clock signal. The precharge signal is applied to the gates of transistors controlling the bit lines, such as transistors 42', 44' controlling bit lines 32', 34'.

Figure 5:
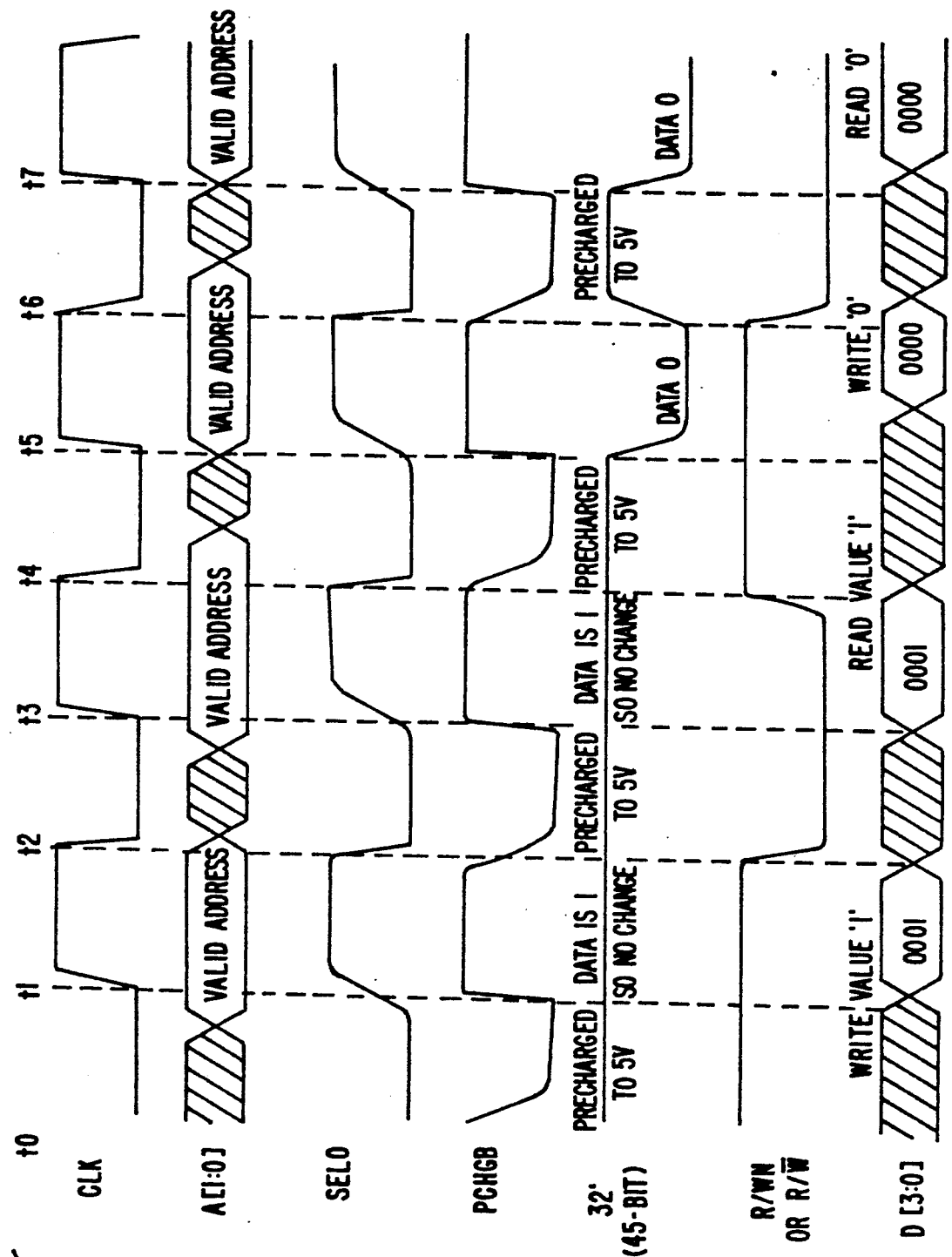
FIG. 5 is a timing diagram to illustrate the operation of the array of FIG. 4.

FIG. 5 is a timing diagram to illustrate the operation of the circuit of FIG. 4. For the purpose of illustration, let us assume that the signal SEL0N is high and the remaining select signals SEL1N-SEL3N are low, thereby selecting the cells U2-U5 for the reading or writing of data in connection with bus 104. Since the processes of reading and writing of data from or into any one of the four cells U2-U5 are identical, the reading and writing process will be described only in reference to the cell U5. The select signal SEL0N essentially follows the clock signal since the same clock signal is used to operate the decoder (not shown in FIG. 4) referred to above.

Before any reading or writing process, all the bit lines are precharged to logic high or about 5 volts by voltage sources VDD in FIG. 4. Thus at time t0 and before time t1, bit lines 32', 34' are charged to 5 volts. At time t1, the clock signal rises, and the precharge signal on line 46' immediately follows, turning off the P-channel transistors 42', 44'. The precharging of the bit lines is done primarily to speed up the reading process. For convenience, the precharging is also performed in the writing process to simplify the circuit design. Transistors 42', 44' are turned off so that the driver (not shown in FIG. 4) driving bus 104 will not have to overcome the voltage VDD when writing to cell U5.

At times t0 and t1, the read/write select signal R/WN is high, indicating a writing process. The data "1" is to be written into cell U5. Therefore, the line D0 supplies a "1" to bit line 32' and a "0" to bit line 34'. At time t1, the clock signal is high and the valid address is provided to the decoder, causing the select signal SEL0N to go high, following closely the rising edge of the clock. The precharge signal PCHGB rises quickly following the clock signal, thereby turning off transistors 42', 44'. As shown in FIG. 5, the bit line 32' in cell U5 therefore remains at 5 volts at time t1 but bit line 34' is pulled to 0. The select signal SEL0 on line 36' rises with the signal SEL0N (i.e., the clock) but at a slower rise time so that the gating transistors of cell U5 (equivalent to transistors 26, 28 of FIG. 1) are turned on after bit line 34', is pulled down to "0". Data "1" is therefore written into cell U5.

At time t2, the read/write select signal R/WN changes state, indicating a reading process. The clock falls low and the select signal SEL0 immediately follows, thereby cutting off cell U5 from the bit lines 32', 34' so that changes of logic state on the bit lines will not affect the data already written in cell U5. The precharge signal has a slow fall time at time t2 so that the P-channel transistors 42', 44' are not turned on until after cell U5 is cut off from the bit lines, thereby assuring that the voltages applied by sources VDD will not affect the data already written into the cell.

When the precharge signal falls low, the P-channel channel transistors 42', 44' are again turned on, causing bit lines 32', 34' to be precharged to 5 volts. As is known to those in the art, precharging the bit lines to logic high is desirable to speed up the reading process. At time t3, the clock rises and again the precharge signal immediately follows, thereby turning off transistors 42', 44'. The select signal SEL0 rises slowly and turns on the gating transistors for cell U5, so that the data stored in the cell U5 will pull down either one of the two bit lines 32', 34' to "0". Since the data stored in U5 at time t3 is a "1", bit line 32' will stay at 5 volts and bit line 34' will be pulled down to "0". As known to those skilled in the art, where bit line 34' falls to a value around 4 volts, a sense amplifier (not shown) connected to bus 104 will sense the voltage difference between bit lines 32', 34' to read a "1" from cell U5. Precharging the bit lines and detecting the voltage difference and polarity of the voltage difference between the two bit lines speeds up the reading process.

At time t4, the clock falls low and the select signal SEL0 immediately follows, thereby isolating the inverters in cell U5 from the bit lines. The precharge signal falls low slowly to again allow the bit lines to be precharged to 5 volts. The read-write signal R/WN changes state indicating a writing cycle.

During the next writing cycle, the precharge and select signals behave in the manner described above at t0, t1 and t2. The data to be written into the cell, however, is a "0" and not a "1" as indicated in FIG. 5. Therefore, after the select signal SEL0 goes high, the gating transistors (equivalent to transistors 26, 28 of FIG. 1) are turned on, the driver driving the data bus 104 causes bit line 32' to be pulled to "0", leaving the bit line 34' at "1". Thus at time t5, the bit line 32' is pulled to "0" as indicated in FIG. 5. At time t6, both the select and precharge signals fall low as at times t2 and t4. The bit line 32' is again precharged to 5 volts. Also at time t6, the read/write signal indicates a reading process. The reading process is essentially as described above between times t2 and t4. Since the data "0" is stored in RAM cell U5, at time t7, the bit line 32' will be pulled low and bit line 34' remains at "1", and the sense amplifier will read a "0".

Figure 6:
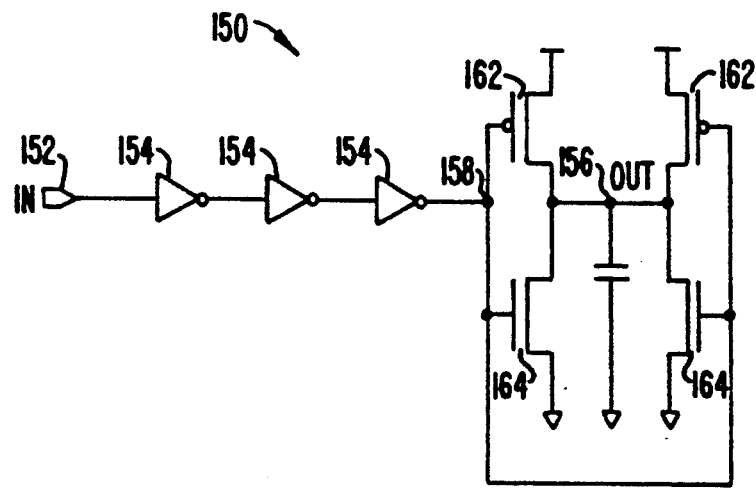
FIG. 6 is a schematic circuit diagram of a conventional output buffer circuit.

FIG. 6 is a schematic circuit diagram of a conventional output buffer useful as background for the invention. As shown in FIG. 6, an input signal at input 152 is inverted by three inverters 154 in series to provide an inverted input signal at node 158. The inverted input signal is then applied through a pair of inverters connected in parallel to an output 156. The two inverters each includes a pull up transistor 162 and a pull down transistor 164. The inverted input signal is applied to the gates of the pull up and pull down transistors of the two inverters. When the input signal at input 152 goes high, node 158 falls low, turning on transistors 162 and turning off transistors 164. When the input signal at input 152 falls low, node 158 goes high, thereby turning off transistors 162 and turning on transistors 164. However, during this transitional period, when transistors 162 are being turned off and transistors 164 are being turned on, there is at least a time period during which transistors 164 are turned on before transistors 162 are completely turned off. This causes significant transient current to appear at the output 156 and is undesirable.

Figure 7:
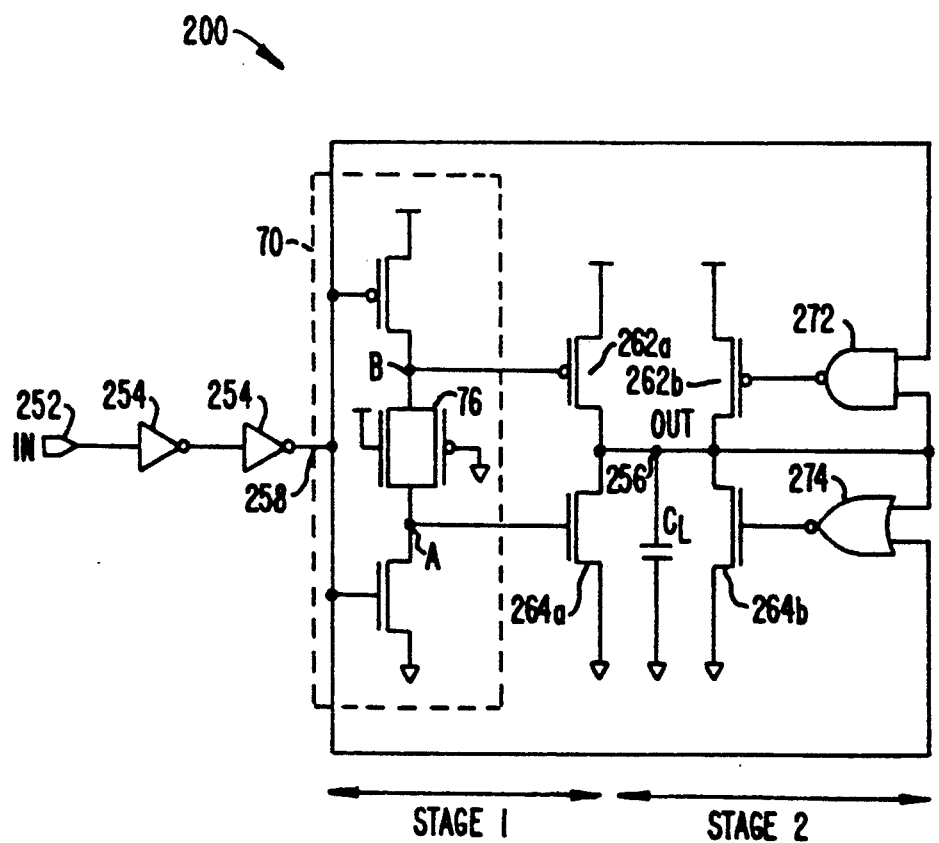
FIG. 7 is a schematic circuit diagram of a buffer circuit employing a control circuit to illustrate the invention.

FIG. 7 is a schematic circuit diagram of an output buffer to illustrate the invention. A comparison of output buffer 200 of FIG. 7 with buffer 150 of FIG. 6 will reveal that, instead of applying the inverted input signal directly to the two pairs of inverters faced in parallel, the twice inverted input signal in FIG. 7 is applied to one of the inverters (labelled stage 1 in FIG. 7) through a control circuit 70 of FIG. 3. As described above in reference to FIG. 3, node B of circuit 70 follows the input signal with a fast rise time and a slow fall time, and node A follows the input signal with a slow rise time and a fast fall time. Therefore, if the input signal was initially low and then rises to the high logic state, node A will immediately fall low but node B will lag behind with a slower fall time. Hence, transistor 264a will be turned off before transistor 262a is turned on. Similarly, when the input signal was initially high and then falls low, transistor 262a will be turned off before transistor 264a is turned on. Therefore, at any one time substantially only one of the transistors 262a 264a is turned on, not both. This will greatly reduce the magnitude of transient current in the buffer.

Figure 8:
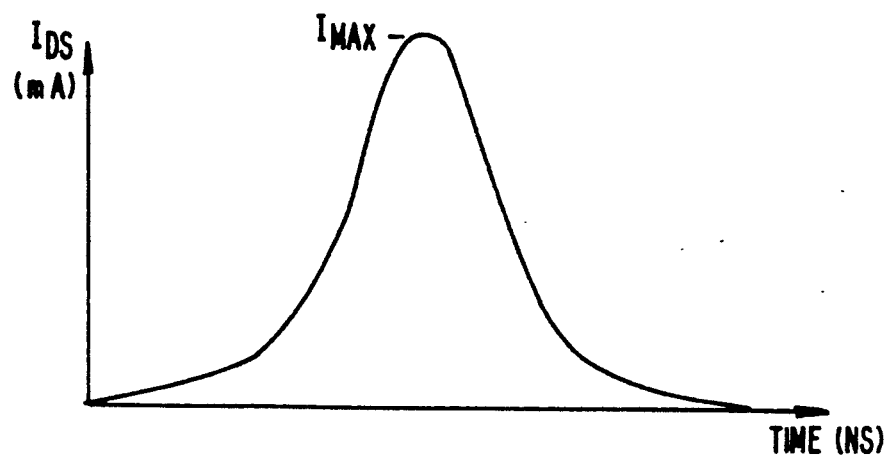
FIG. 8 is a graphical illustration of the transient current generated in the conventional output buffer of FIG. 6.
Figure 9:
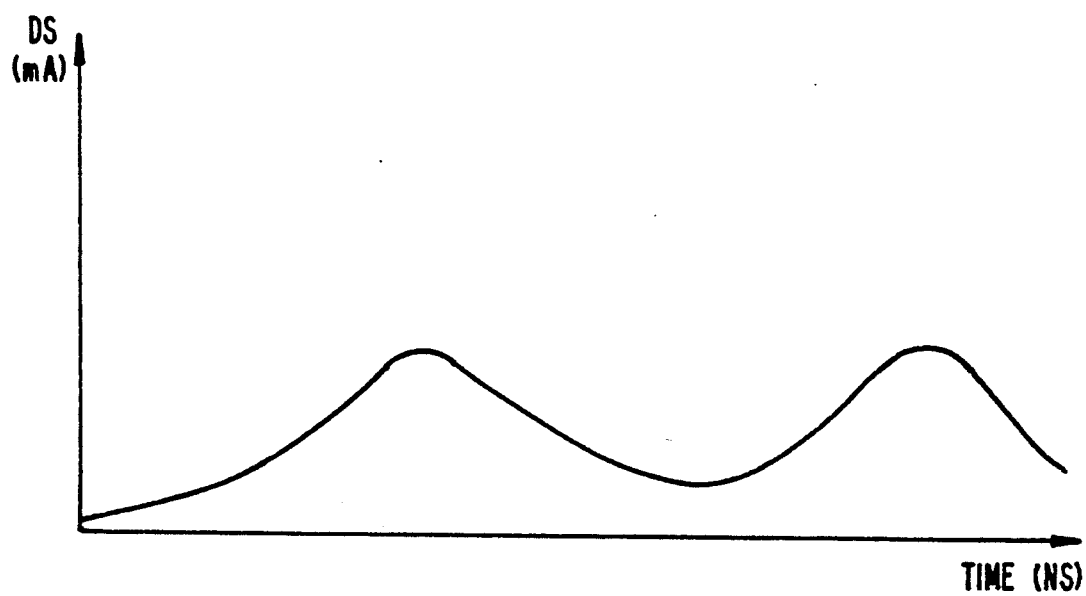
FIG. 9 is a graphical illustration of the transient current generated in the buffer of FIG. 7.

The performance of buffers 150, 200 is illustrated in FIGS. 8 and 9. FIG. 8 is a graphical illustration of the current output at node 156 of buffer 150 and FIG. 9 is a graphical illustration of the current output of buffer 200 at output 256. As illustrated in FIG. 8, since there is a time period during which transistors 162, 164 in the two pairs of transistors in parallel are all turned on, the peak transient current is high. In contrast, since only one of transistors 262a, 264a is on at any one time, the peak transient current is much reduced as illustrated in FIG. 9.

According to another aspect of the invention, the twice inverted input signal at node 258 is not applied directly to the other inverter (marked stage 2 in FIG. 7) in parallel with the inverter comprising transistors 262a, 264a. Instead, it is applied through a NAND gate 272 to the gate of transistor 262b. NAND gate 272 also receives as an input the output signal at 256 through a feedback path. The twice inverted signal at node 258 is also applied through a NOR gate 274 to the gate of transistor 264b and the NOR gate receives as another input the output signal at node 256 through a feedback path. As indicated in FIG. 7, these features comprise stage two of the output buffer and are used to control the slew rate at output 256.

In FIG. 6, since the inverted input signal at node 158 is applied directly to the gate of the two pairs of inverters placed in parallel, the transistors 162, 164 in the two inverters are turned on or off simultaneously. In contrast, in FIG. 7, due to the feedback action through gates 272, 274, and the thresholds of the gates, transistors 262b, 264b are turned on or off after transistors 262a, 264a. In other words, even though the voltage at node 258 has risen to a level so that the gate voltage will cause the transistor 262a to be turned off, the voltage at the gate of transistor 262b still has not risen to the level to turn off the transistor. This is due to the fact that in order for the gate voltage of transistors 262b to rise, the voltage at node 258 has to rise to a level above the threshold of gate 272. Furthermore, the feedback of the output signal at output 256 to gate 272 also reduces the slew rate.

In a similar manner, the feedback path through gate 274 to the gate of transistors 264b and the application of the twice inverted signal at node 258 through gate 274 also control the slew rate of transistor 264b. The effect of the first and second stages in buffer 200 in comparison with buffer 150 is illustrated with the help of FIGS. 10 and 11.

Figure 10:
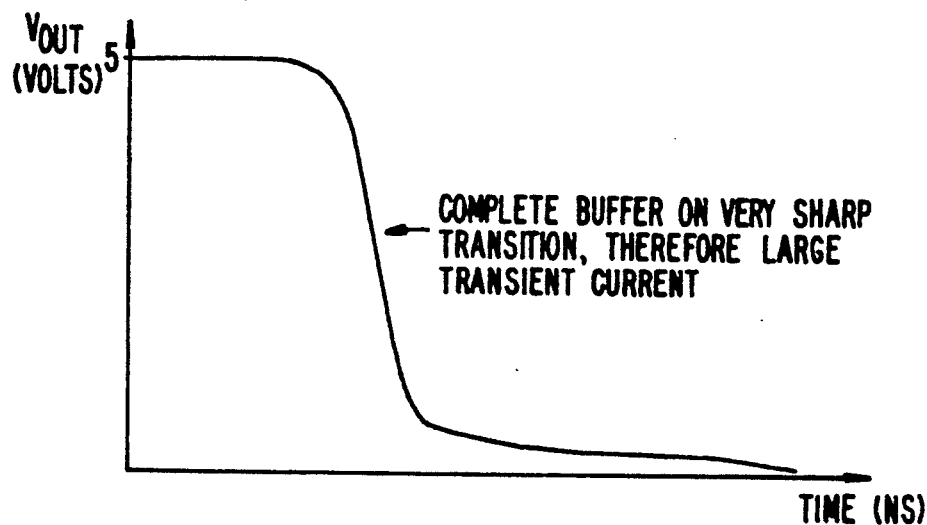
FIG. 10 is a graphical illustration of the output voltage of the conventional buffer of FIG. 6.
Figure 11:
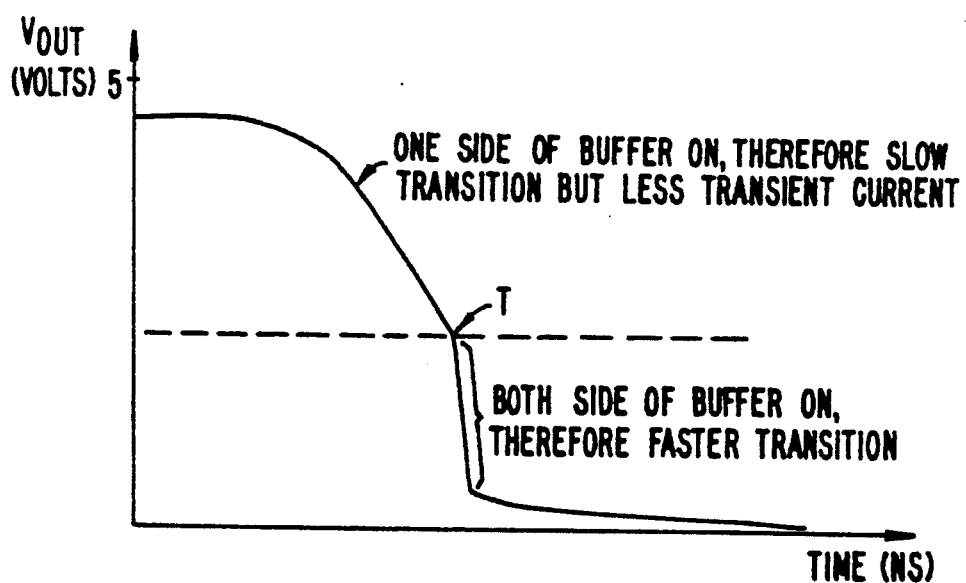
FIG. 11 is a graphical illustration of the output voltage of the buffer of FIG. 7 to illustrate the invention.

FIG. 10 is a graphical illustration of the voltage output at node 156 of buffer 150. FIG. 11 is a graphical illustration of the voltage output at node 256 of buffer 200. As shown in FIGS. 10 and 11, the output voltage of buffer 150 has a short transition so that large transient currents will be present. In contrast, the output voltage of buffer 200 will have a slower transition and therefore less transient current. The difference is particularly pronounced in the earlier part of the cycle before time T. Before time T, only transistors 262a or 264a is turned on and transistors 262b, 264b are off since the input voltages to gates 272, 274 have not exceeded the thresholds of the two gates. At time T, transistor 262b or 264b are turned on so that the output voltage at output 256 will have fast transition as shown in FIG. 11.

In reference to FIG. 3, it will be noted that the passing gate 76 is used in essence as a resistor. In a further improvement, particularly when circuit 70 is used for controlling a buffer, the passing gate may be controlled so that it is tri-statable. This is illustrated in FIG. 12.

Figure 12:
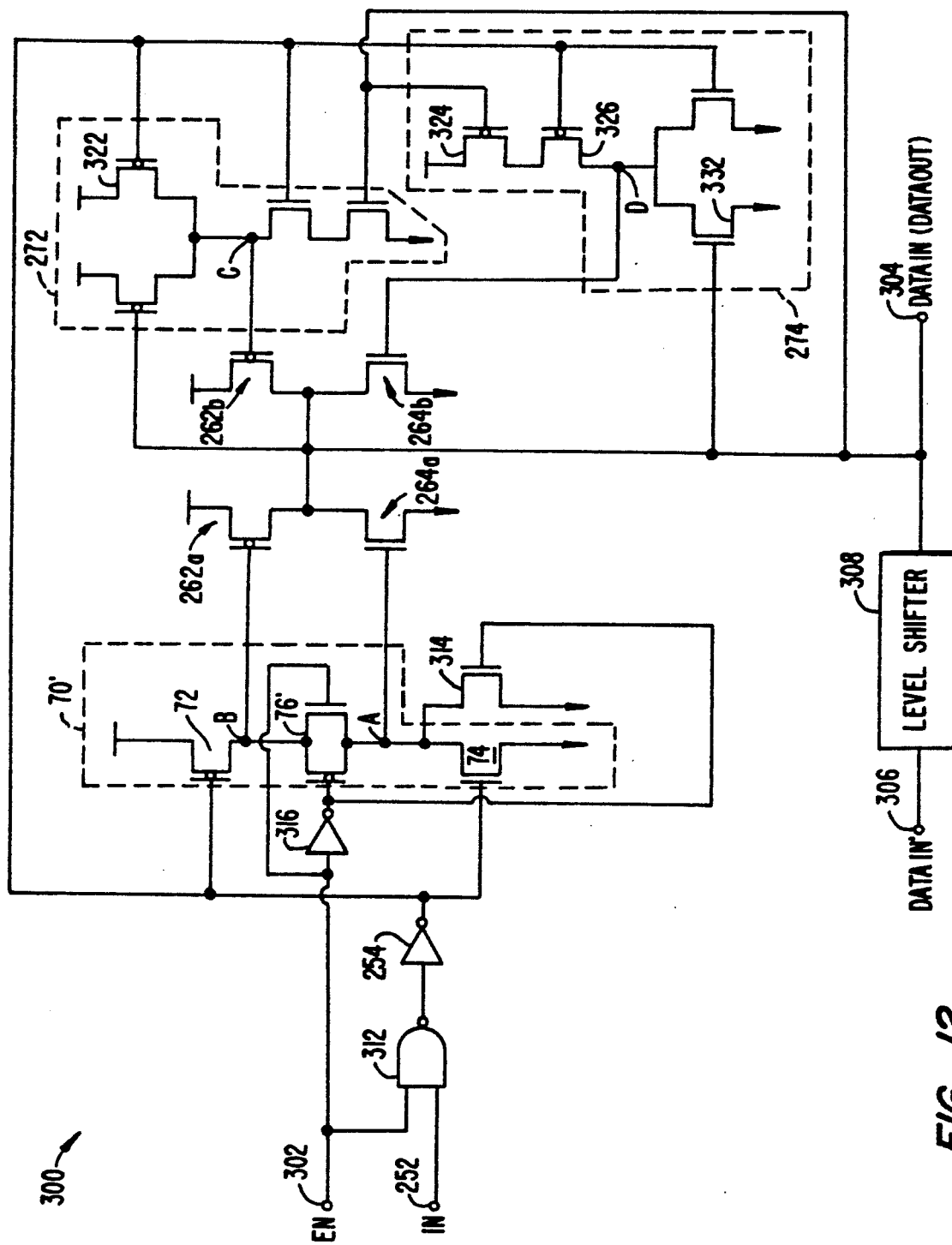
FIG. 12 is a schematic circuit diagram of a bi-directional input/output buffer to illustrate the invention.

FIG. 12 is a schematic circuit diagram of a bi-directional input/output buffer. Buffer 300 of FIG. 12 is similar to buffer 200 of FIG. 7 except that buffer 300 includes an enabling feature for enabling or disabling the passing gate as well as the buffer. For simplicity, identical components in FIGS. 7 and 12 are identified by the same numerals. As shown in FIG. 12, passing gate 76' is not always turned on. It is turned on or off by an enabling signal applied to node 302. Thus when the enabling signal is high, passing gate 76' is turned on and when the enabling signal at node 302 is low, the passing gate 76' is turned off.

Buffer 300 is particularly useful when implemented in integrated circuit where it is desirable to use the output of the buffer at an output pin as an input pin in certain circumstances. The enabling feature in circuit 300 may also be used to disable the buffer so that the output pin can be used as an input pin without interference from the buffer. In FIG. 12, the output of the buffer is at terminal 304. Where it is desirable to use the terminal 304 as an input, buffer 300 is disabled and terminal 304 is used as an input for supplying input signals to terminal 306 through a level shifter 308.

When the enabling signal at terminal 302 is high, the buffer is enabled so that terminal 304 serves as the output buffer. When the enabling signal is high, NAND gate 312 acts simply as an inverter so that the NAND gate 312 and inverter 254 are essentially the same as inverters 254 of FIG. 7. When the enabling signal is high, the passing gate 76' is enabled so that circuit 76' is the same as circuit 70 in FIG. 7. When the enabling signal is high, transistor 314 is turned off so that circuit 70' functions in a manner similar to circuit 70 in FIG. 7 to reduce transient current in transistors 262a, 264a. NAND gate 272 and NOR gate 274 function in the same manner as described in reference to FIG. 7 to control the slew rate of buffer 300.

When the enabling signal at terminal 302 is low, the output of NAND gate 312 is high so that the output of inverter 254 in FIG. 12 is low. This turns on transistor 72 and turns off transistor 74. Node B is therefore pulled high to turn off transistor 262a. The output of inverter 316 is high, turning on transistor 314. Node A is therefore pulled low to turn off transistor 264a. The output of inverter 254 is low, thereby turning on transistor 322. Node C is pulled high, thereby turning off transistor 262b. Transistor 264b is not affected by the enabling feature described above; it will be shown below that this will not affect the bi-directional nature of the buffer.

Thus when the input to terminal 304 is low, this will turn on transistor 324. Transistor 326 is already turned on since the output of inverter 254 in FIG. 12 is low when the enabling signal at terminal 302 is low. Therefore, node D is high and transistor 264b is turned on, thereby reinforcing the low logic state of input 304. When the input signal to terminal 304 is high, transistor 324 is turned off. Transistor 332 is turned on, thereby pulling low node D. This turns off transistor 264b, thereby totally isolating the buffer from terminal 304.

From the above, it will be seen that the tristatable passing gate 76' permits buffer 300 to be tristated so that terminal 304 can be used as an output for the buffer or as an input. Therefore, if circuit 300 is implemented in an integrated circuit and terminal 304 is a pin for the circuit, pin 304 can be an input/output pin.

The invention has been described above in reference to various embodiments. It will be understood that various modifications may be made without departing from the invention whose scope is to be limited only by the appended claims.

What is claimed is:

1. A static random access memory array device comprising:
   an array of static random access memories arranged in rows and columns, each memory including a pair of inverters gated by two n-channel FETs to two terminals, one on each side of the inverters;
   a plurality of select lines, each select line connected to the gates of the FETs of a corresponding row of memories;
   a plurality of bit lines, each bit line connected to one of the two terminals of a corresponding column of memories;
   a plurality of p-channel FETs, each p-channel FET connected to a bit line for gating the bit line;
   one or more control circuits responsive to a clock signal for deriving control signals for controlling the reading or writing of data between the memories and the plurality of bit lines, each circuit including:
   (a) a pull up transistor having a first and a second terminal and a gate;
   (b) a passing gate which is turned on;
   (c) a pull down transistor having a first and a second terminal and a gate, the second terminals of the two transistors being connected through said passing gate, said gates of the two transistors being controlled by a signal;
   (d) means for applying voltages to the first terminals of the two FETs so that the first terminals are at opposite logic states, said gates of the pull up and pull down transistors being controlled by the clock signal; and
   means for applying signals at the second terminals of the pull down transistors of the circuits to drive the select lines and for applying the signal at the second terminal of a pull up transistor of the circuits to the gates of said p-channel FETs to control the bit lines in response to the clock signal.

2. The circuit of claim 1, wherein the pull up transistor is a p-channel FET and the pull down transistor is an n-channel FET.

3. A buffer comprising:
an inverter including a pull up transistor and a pull down transistor each having two terminals and a gate, said buffer having an input and an output, one terminal of each of said transistors being connected to the output of the circuit;
a control circuit including:
  (a) a pull up transistor having a first and a second terminal and a gate;
  (b) a passing gate which is turned on;
  (c) a pull down transistor having a first and a second terminal and a gate, the second terminals of the two transistors of the circuit being connected through said passing gate, said gates of the two transistors of the circuit being controlled by an input signal at the input of the buffer;
  (d) means for applying voltages to the first terminals of the two transistors so that the first terminals are at opposite logic states; and
means for applying the signals at the two second terminals of the circuit to control the gates of the two transistors of the inverter in response to the signal at the input of the buffer, wherein a first control signal at the second terminal of the pull up transistor has a fast rise time and slow fall time with respect to the input signal and a second control signal at the second terminal of the pull down transistor has a fast fall time and slow rise time with respect to the input signal, so that transient current in the buffer is reduced.

4. The circuit of claim 3, wherein the pull up transistor is a p-channel FET and the pull down transistor is an n-channel FET.

5. A buffer comprising:
a first inverter including a first pull up transistor and a first pull down transistor each having two terminals and a gate, said buffer having an input and an output, one terminal of each of said first transistors being connected to the output of the buffer, the gates of the first transistors being controlled by an input signal at the input of the buffer or a signal derived therefrom;
a second inverter including a second pull up transistor and a second pull down transistor each having two terminals and a gate, one terminal of each of said second transistors being connected to the output of the buffer;
a first feedback path for deriving a first slew rate control signal from the input signal and an output signal at the buffer output for controlling the gate of the second pull up transistor; and
a second feedback path for deriving a second slew rate control signal from the input signal and the output signal at the buffer output for controlling the gate of the second pull down transistor thereby controlling the slew rate of the buffer.

6. The buffer of claim 5, wherein the first feedback path includes a NAND-gate and the second feedback path includes a NOR-gate.

* * * * *